(12) United States Patent
Jimenez, III et al.

(10) Patent No.: US 9,515,399 B2
(45) Date of Patent: *Dec. 6, 2016

(54) CONNECTOR ALIGNMENT SYSTEM

(71) Applicant: Dell Products L.P., Round Rock, TX (US)

(72) Inventors: Salvador D. Jimenez, III, Cedar Park, TX (US); Corey Dean Hartman, Hutto, TX (US); Bernard Strmiska, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/094,747

(22) Filed: Apr. 8, 2016

(65) Prior Publication Data

US 2016/0226164 A1    Aug. 4, 2016

Related U.S. Application Data

(63) Continuation of application No. 14/336,700, filed on Jul. 21, 2014, now Pat. No. 9,313,913.

(51) Int. Cl.
| | |
|---|---|
| *H01R 12/70* | (2011.01) |
| *H05K 7/14* | (2006.01) |
| *H05K 3/30* | (2006.01) |
| *H01R 12/72* | (2011.01) |
| *G06F 1/18* | (2006.01) |

(52) U.S. Cl.
CPC ......... *H01R 12/7005* (2013.01); *G06F 1/185* (2013.01); *H01R 12/722* (2013.01); *H05K 3/301* (2013.01); *H05K 7/1418* (2013.01); *H05K 7/1435* (2013.01)

(58) Field of Classification Search
CPC . H01R 12/7005; H01R 12/722; H05K 7/1435; H05K 7/1418; H05K 3/301; G06F 1/185
USPC .................... 361/756; 439/629, 66
See application file for complete search history.

(56) References Cited

U.S. PATENT DOCUMENTS

| | | |
|---|---|---|
| 4,314,312 A | 2/1982 | Donmoyer et al. |
| 6,159,040 A | 12/2000 | Chang et al. |
| 6,431,879 B2 | 8/2002 | Brekosky et al. |
| 6,639,806 B1 | 10/2003 | Chuang et al. |

(Continued)

*Primary Examiner* — Adrian S Wilson
*Assistant Examiner* — Abhishek Rathod
(74) *Attorney, Agent, or Firm* — Haynes and Boone, LLP

(57) ABSTRACT

A stacked connector alignment system includes a board with processor and a board connector coupled to the processor. An alignment element is mounted to the board adjacent the board connector. The alignment element includes first alignment members and second alignment members that are spaced apart from the first alignment members. A first component includes a primary first component connector and a secondary first component connector that is located on an opposite surface of the first component from the primary first component connector, and the first alignment members are configured to engage the first component to align the primary first component connector with the board connector. A second component includes a second component connector, and the second alignment members are configured to engage the second component to align the second component connector with the secondary first component connector when the primary first component connector is connected to the board connector.

20 Claims, 17 Drawing Sheets

(56) References Cited

U.S. PATENT DOCUMENTS

| | | |
|---|---|---|
| 7,101,188 B1 | 9/2006 | Summers et al. |
| 7,393,230 B2 | 7/2008 | Yang et al. |
| 7,473,100 B2 | 1/2009 | Moritake |
| 7,503,792 B2 | 3/2009 | Xiao |
| 7,540,785 B1 | 6/2009 | Zhao |
| 8,092,233 B1 | 1/2012 | Lee et al. |
| 8,475,214 B2 | 7/2013 | Shtargot et al. |
| 8,764,457 B2 | 7/2014 | Chen et al. |
| 8,951,070 B1 | 2/2015 | Goodwin |
| 2009/0104810 A1 | 4/2009 | Matsuzawa |
| 2010/0134989 A1 | 6/2010 | Strmiska et al. |
| 2011/0300759 A1 | 12/2011 | Ngo |
| 2013/0135813 A1 | 5/2013 | Jimenez, III et al. |
| 2014/0065887 A1 | 3/2014 | Kida et al. |
| 2014/0078664 A1 | 3/2014 | Lau et al. |
| 2016/0021777 A1 | 1/2016 | Jimenez, III et al. |
| 2016/0056560 A1 | 2/2016 | Farkas et al. |

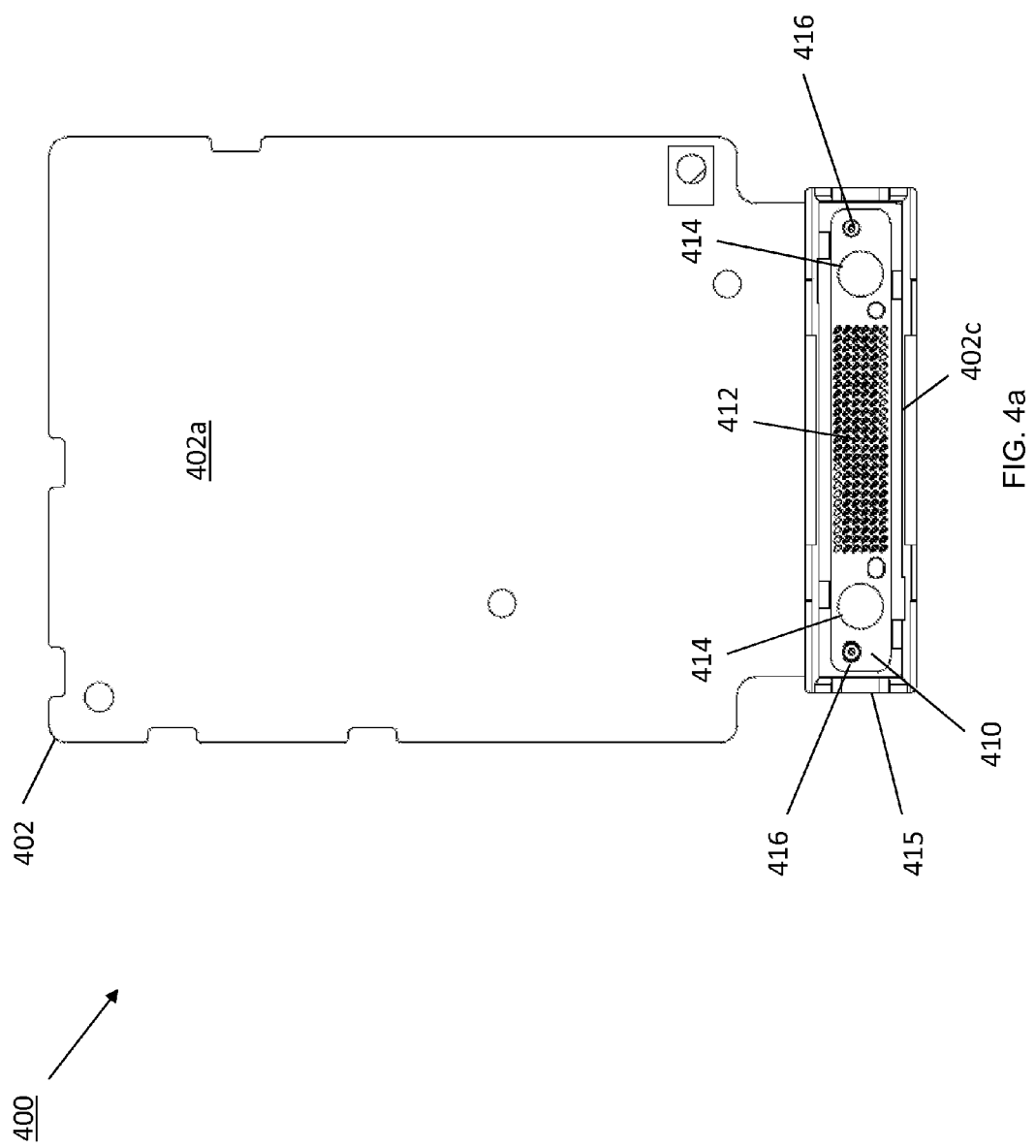

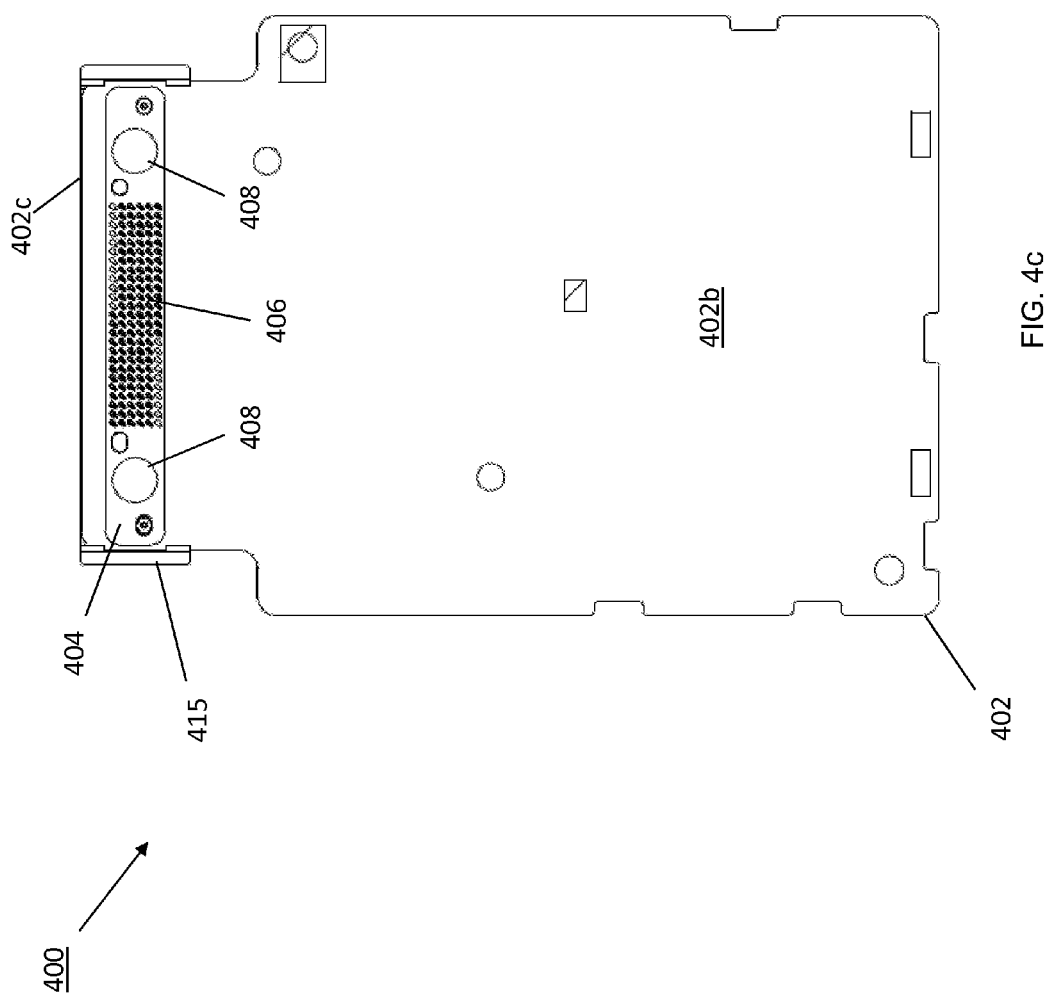

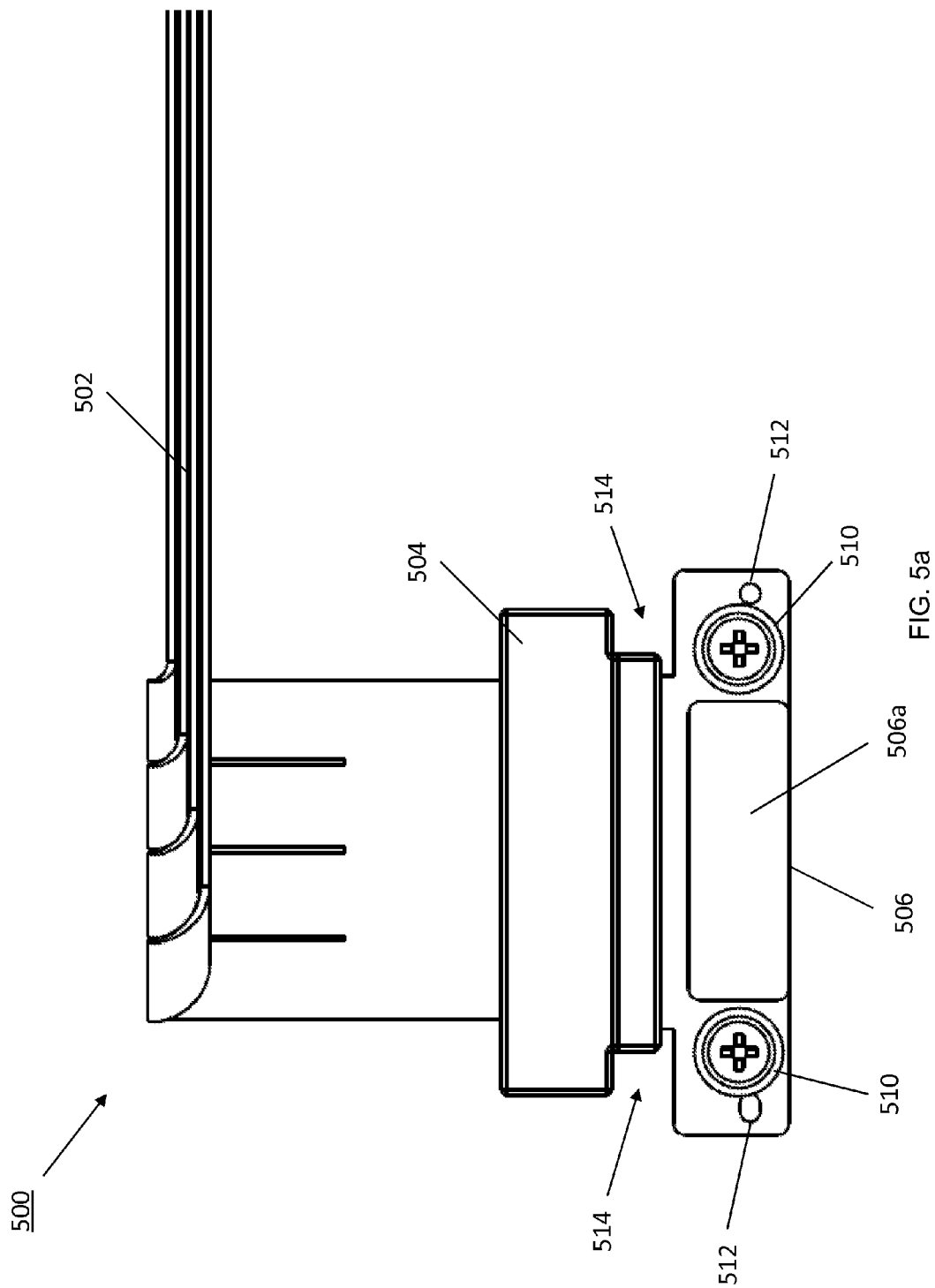

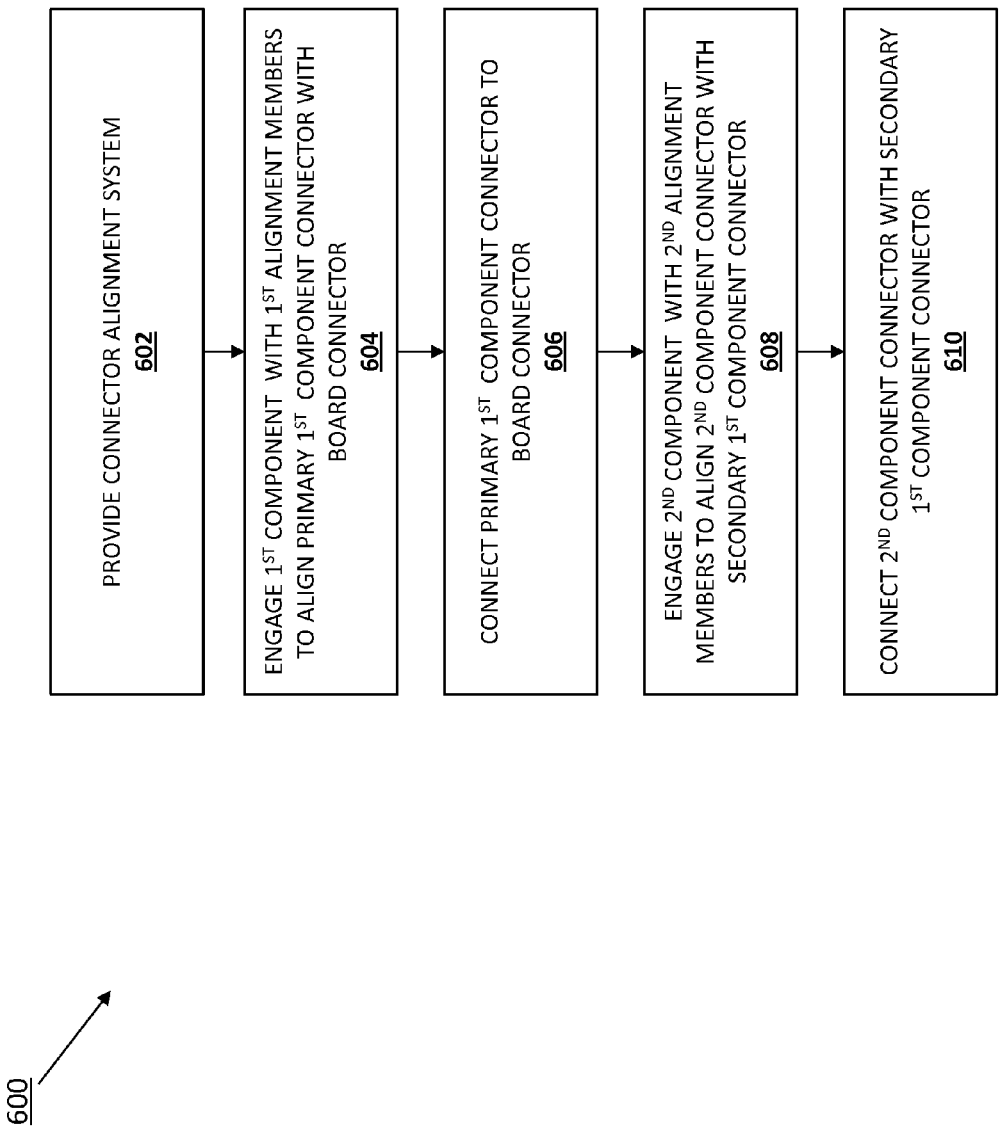

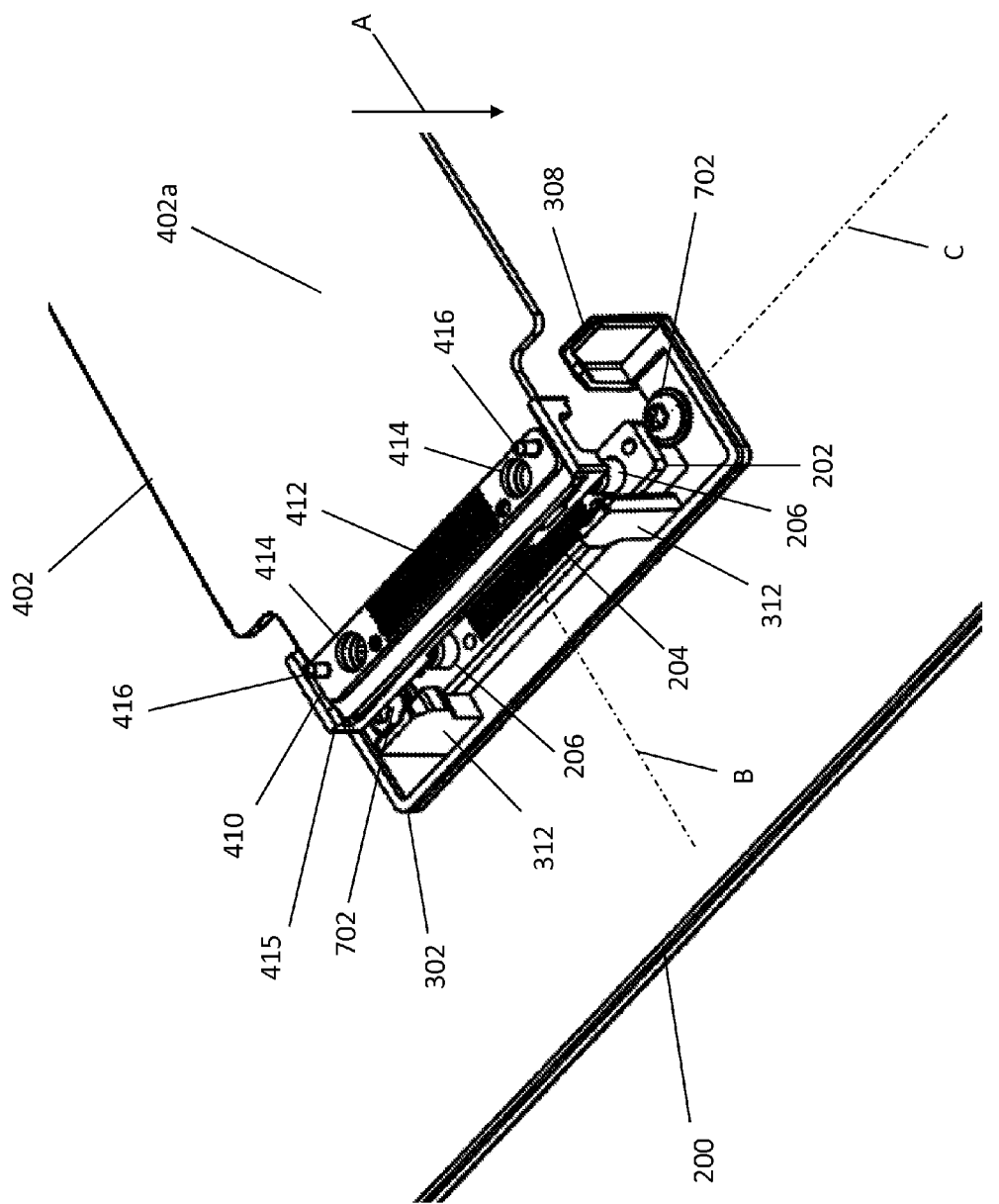

CONNECTOR ALIGNMENT SYSTEM

CROSS REFFENCE TO RELATED APPLICATIONS

This is a Continuation application to U.S. Utility application Ser. No. 14/336,700 filed Jul. 21, 2014, entitled "CONNECTOR ALIGNMENT SYSTEM," the disclosure of which is incorporated herein by reference in its entirety.

BACKGROUND

The present disclosure relates generally to information handling systems, and more particularly to an alignment system for connectors.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs utilized connector systems in which connectors for multiple components may be stacked adjacent and/or on top of each other. For example, a circuit board may include a first connector, a mezzanine card may include a plurality of second connectors, and a cable may include a third connector, and a stacked connector system is provided when one of the second connectors on the mezzanine card is connected to the first connector on the circuit board, and the third connector on the cable is connected to the other of the second connectors on the mezzanine card. In many situations, it can be difficult to align the one of the second connectors on the mezzanine card and the first connector on the circuit board, and/or align the third connector on the cable and the other of the second connectors on the mezzanine card. Misalignment of connectors in the connector system can result in limited functionality in the IHS, damage to connectors, damage to other components in the IHS, and/or a variety of other problems known in the art.

Conventional solutions to these problems are to provide guide pins extending from one of the connectors that engage guide channels defined by another of the connectors to align the connectors. However, misalignment of the connectors at distances that are greater than the length of the guide pins can result in the guide pins contacting and damaging connector pads and/or connector pins. Furthermore, space constraints that are typical to IHSs can result in relatively low height allowances than inhibit or prevent the use of guide pins in connector systems.

Accordingly, it would be desirable to provide an improved connector alignment system.

SUMMARY

According to one embodiment, a connector alignment system includes a base member that defines a board connector channel and that includes at least one board mounting feature that is configured to mount the base member to a board that includes a board connector such that the board connector is located immediately adjacent the board connector channel; a plurality of first alignment members that extend from the base member on opposite sides of the board connector channel, wherein the plurality of first alignment members define a first alignment channel that is configured to align a primary first component connector on a first component with the board connector along a first axis when the base member is mounted to the board; and a plurality of second alignment members that extend from the base member in a spaced apart relationship from the plurality of first alignment members, wherein the plurality of second alignment members define a second alignment channel that is configured to align a second component connector on a second component with a secondary first component connector on the first component along the first axis when the primary first component connector on the first component is connected to the board connector.

BRIEF DESCRIPTION OF THE DRAWINGS

FIG. 3b is a front view illustrating an embodiment of the alignment element of FIG. 3a FIG. 3c is a top view illustrating an embodiment of the alignment element of FIG. 3a.

FIG. 3d is a rear illustrating an embodiment of the alignment element of FIG. 3a.

FIG. 4a is a top view illustrating an embodiment of a card.

FIG. 4b is a front view illustrating an embodiment of the card of FIG. 4a.

FIG. 4c is a bottom view illustrating an embodiment of the card of FIG. 4a.

FIG. 5a is a top view illustrating an embodiment of a cabling system.

FIG. 5b is a front view illustrating an embodiment of the cabling system of FIG. 5a.

FIG. 5c is a bottom view illustrating an embodiment of the cabling system of FIG. 5a.

FIG. 6 is a flow chart illustrating an embodiment of a method for aligning connectors.

FIG. 7b is a top view illustrating an embodiment of the alignment element and the circuit board of FIG. 7a.

FIG. 8 is a perspective view illustrating an embodiment of the card of FIGS. 4a-4c being connected to the circuit board of FIG. 2 using the alignment element of FIGS. 3a-3d.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
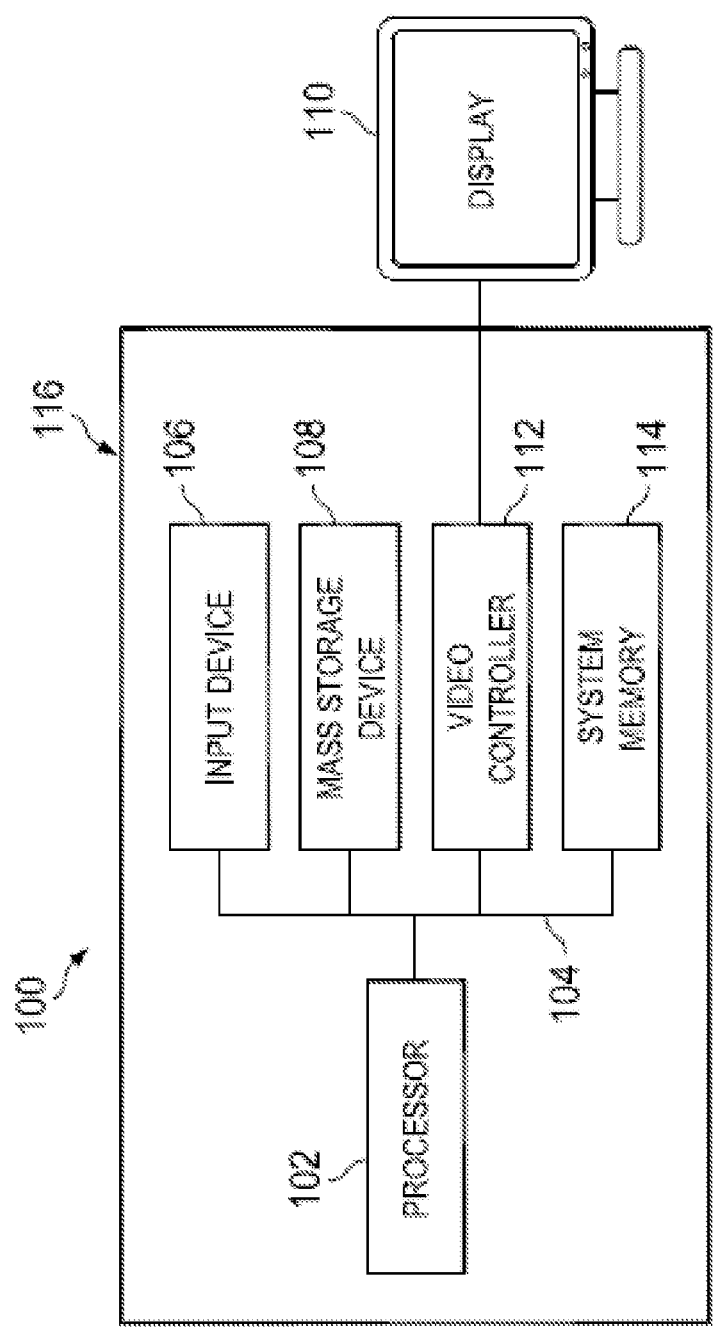
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
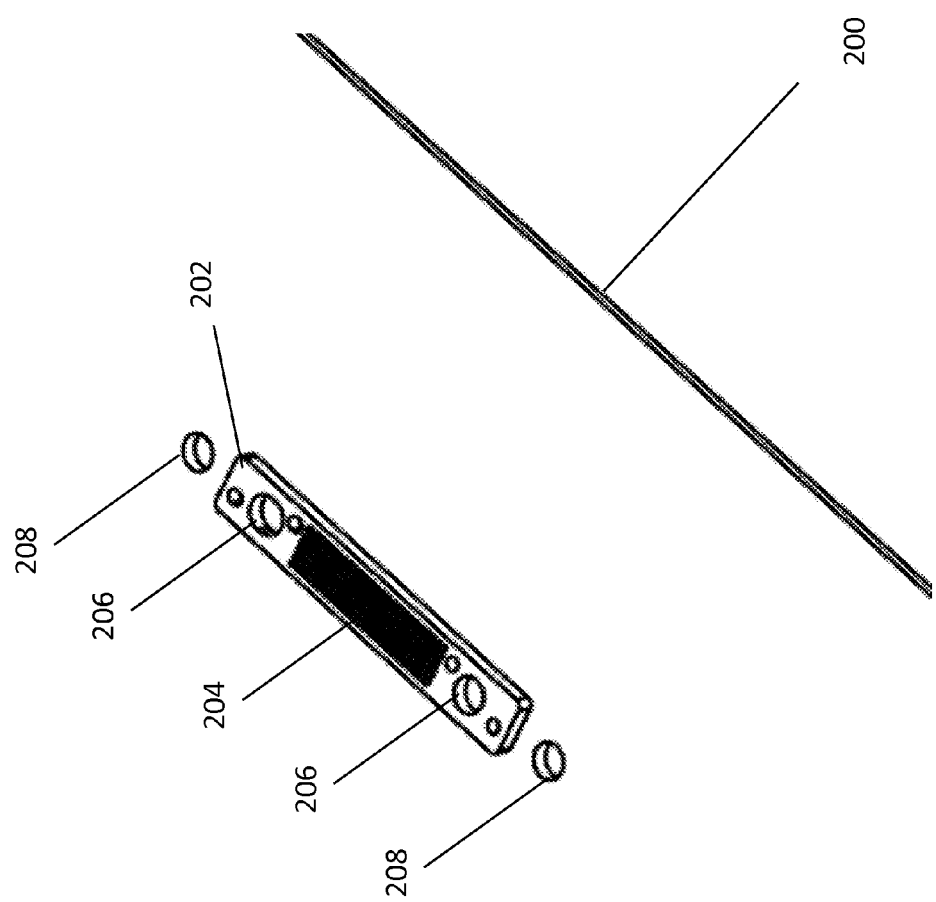
FIG. 2 is a perspective view illustrating an embodiment of a circuit board.
Figure 3A:
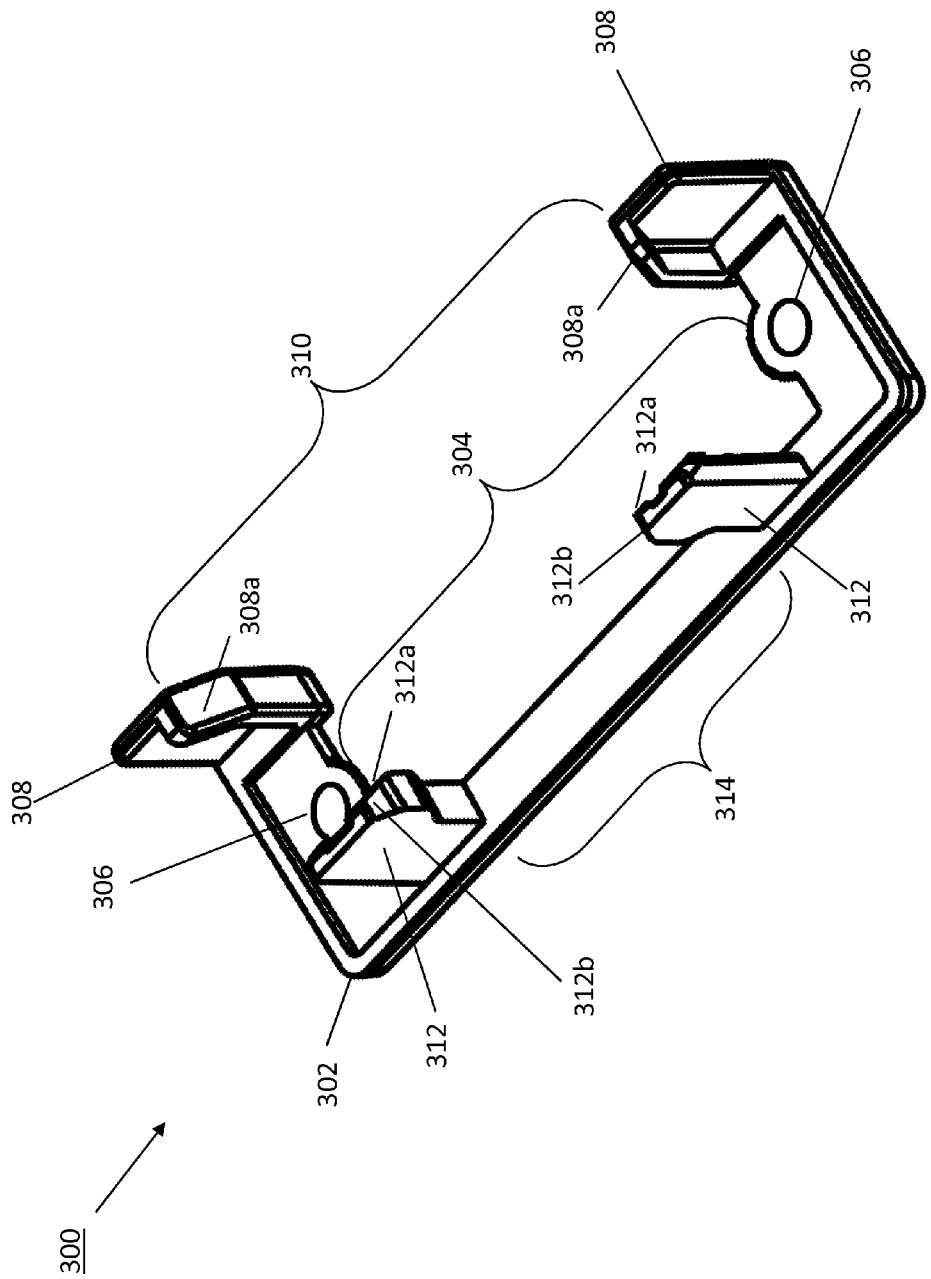
FIG. 3a is a perspective view illustrating an embodiment of an alignment element.
Figure 3B:
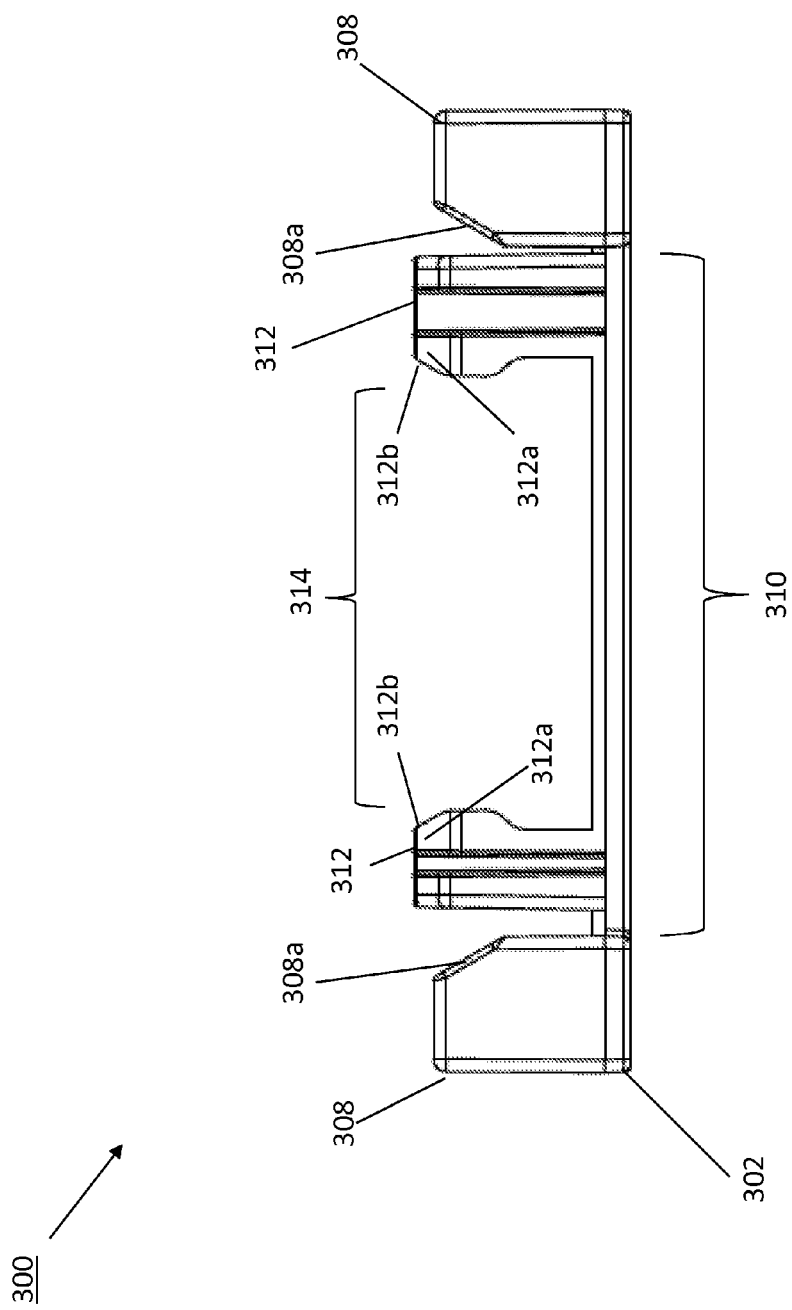
Figure 3C:
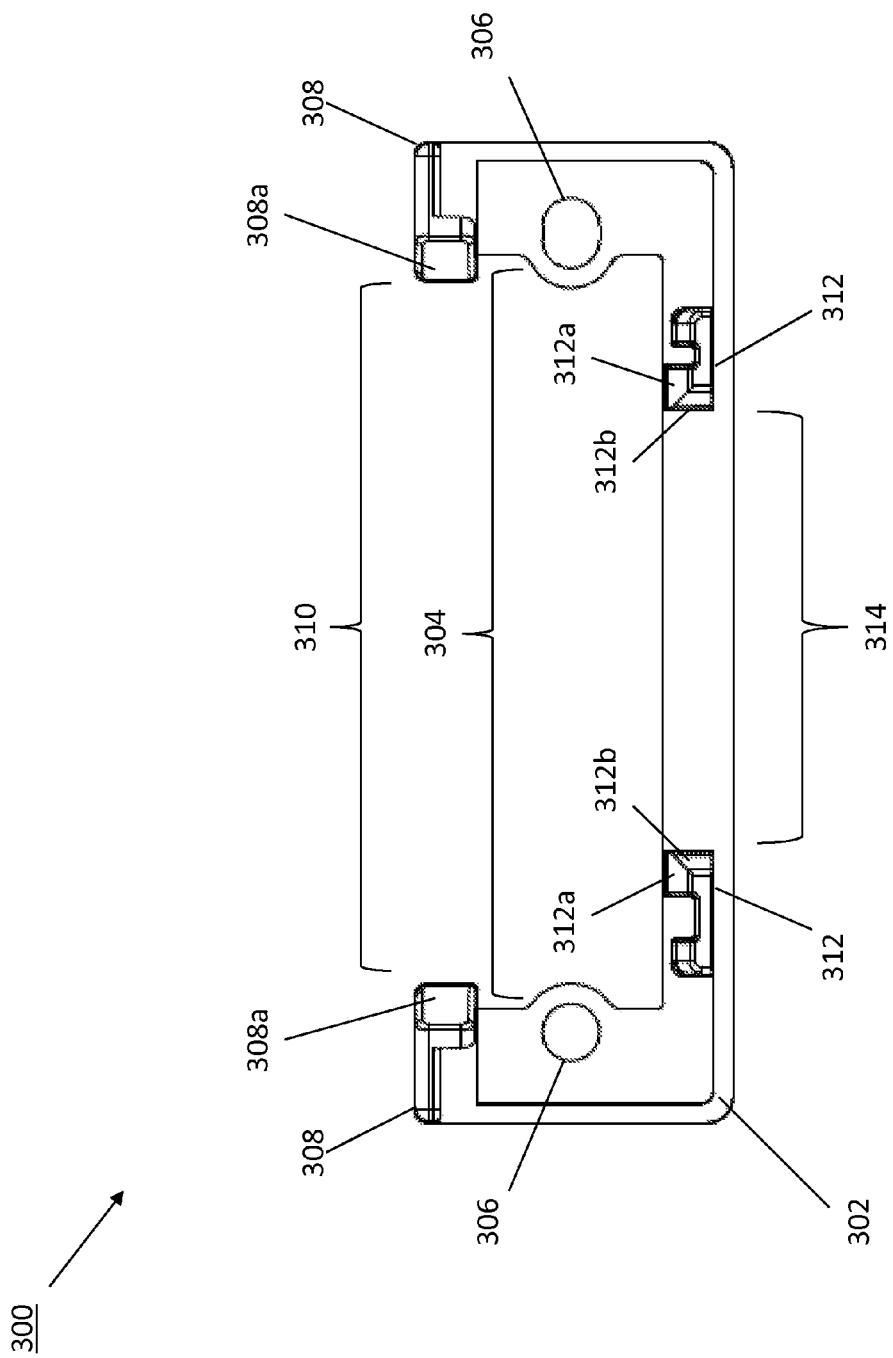
Figure 3D:
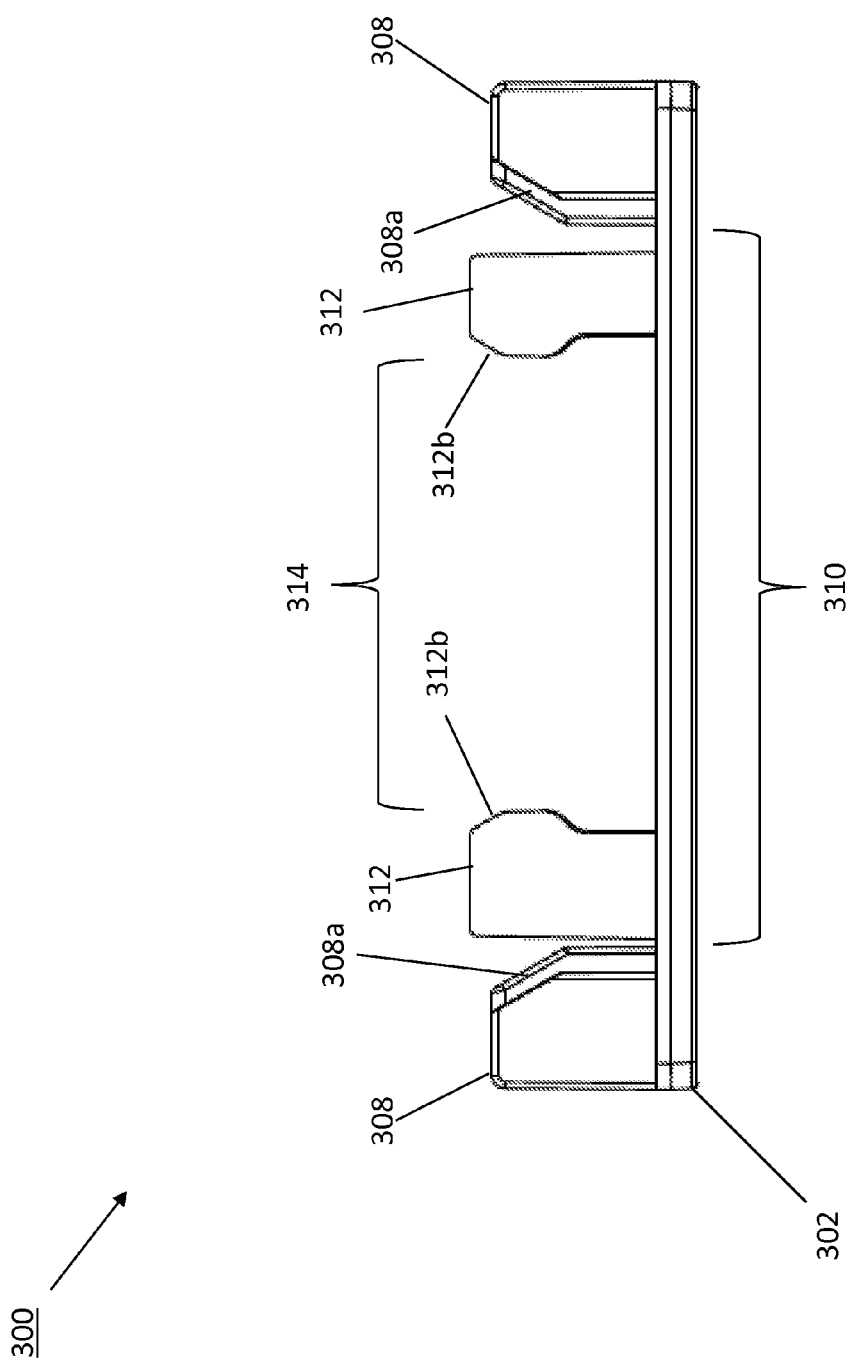

Referring now to FIG. 2, an embodiment of a board 200 including a board connector 202 is illustrated. In an embodiment, the board 200 may be a variety of circuit boards known in the art such as, for example, a motherboard that may be housed in the IHS 100 discussed above with reference to FIG. 1. In an embodiment, the board connector 202 may be a board connector that is configured to electrically couple with a compression connector, discussed in further detail below. While the board connector 202 is illustrated as raised from the board 200 for clarity of illustration and discussion, the board connector 202 may simply include connector pads 204 that are provided on the board 200 and that are coupled to traces in the board 200. As such, the board connector may be integral to the board 200 rather than including a separate connector that has been attached to the board 200. The board connector 202 (and/or the board 200) also defines first board retention channels 206 that are located on opposite sides of the connector pads 204 and that may be threaded or include other features for securing to a retention member, discussed in further detail below. The board 200 also defines second board retention channels 208 that are located on opposite sides of the board connector 202 and that may be threaded or include other features for securing to a retention member, discussed in further detail below. In an embodiment, the board 200 may couple to a variety of IHS components known in the art including, for example, the processor 102 and the system memory 114 discussed above with reference to FIG. 1, and thus the board connector 202 (e.g., the connector pads 204) may be coupled to those IHS components through the board 200. In a specific embodiment, the board 200, board connector 202, and/or other board features may be provided as part of a stacked compression connector system described in U.S. patent application Ser. No. 14/467,807, attorney docket number 102450.00152, filed on Aug. 25, 2014, the disclosure of which is incorporated by reference herein in its entirety.

Referring now to FIGS. 3a, 3b, 3c, and 3d, an embodiment of an alignment element 300 is illustrated. The alignment element 300 includes a base member 302 that defines a board connector channel 304. The base member 302 also defines a plurality of board mounting features 306 that are located on opposite sides of the board connector channel 304 and that may be threaded or include other features for securing to a retention member, discussed in further detail below. A plurality of first alignment members 308 extend from the base member 302 on opposite sides of the board connector channel 304 and define a first alignment channel 310 between them. Each of the plurality of first alignment members 308 include a beveled edge 308a that is located adjacent the first alignment channel 310. A plurality of second alignment members 312 extend from the base member 302 in a spaced apart relationship along an edge of the board connector channel 304 and define a second alignment channel 314 between them. The plurality of second alignment members 312 provide a first set of beveled edges 312a adjacent the board connector channel 304, and provide a second set of beveled edges 312b adjacent the second alignment channel 314.

Figure 4B:
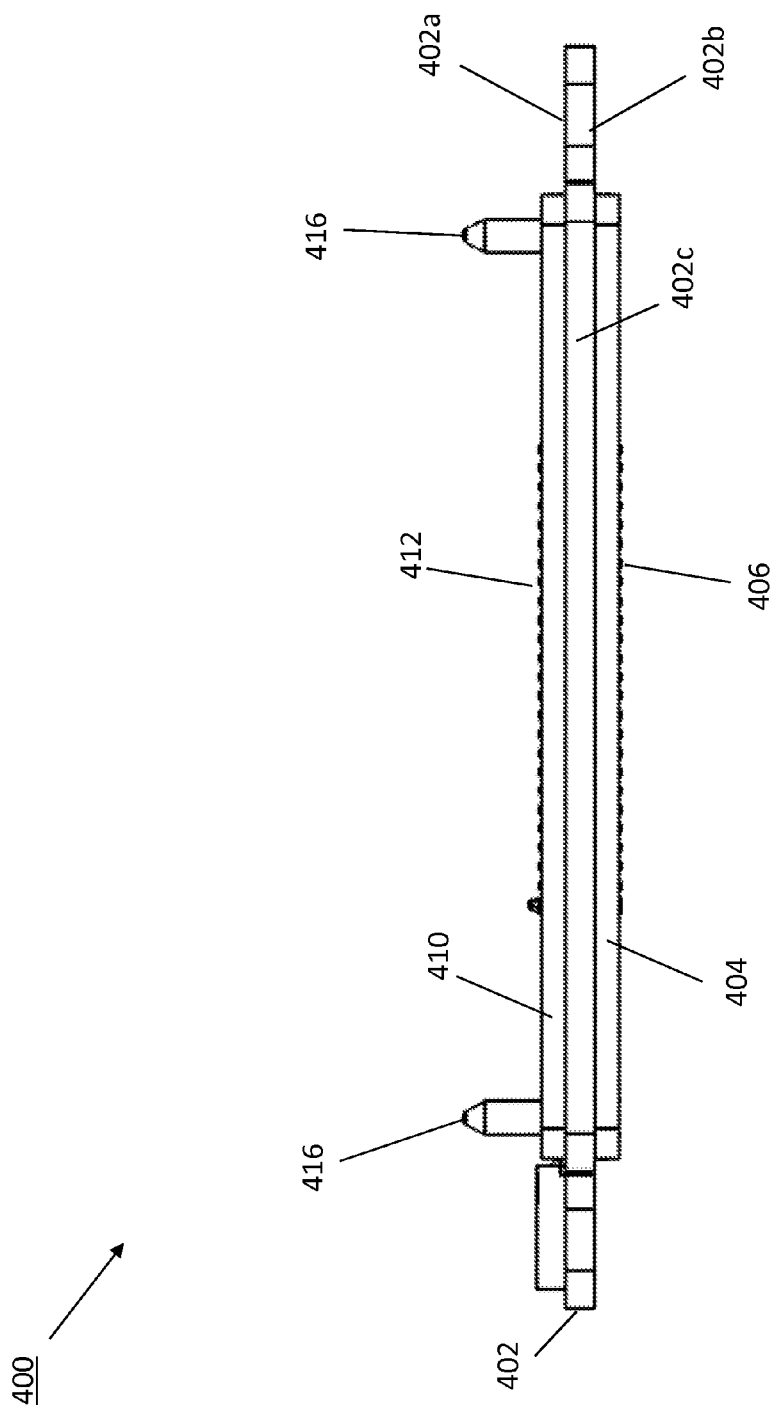

Referring now to FIGS. 4a, 4b, and 4c, an embodiment of a first component 400 is illustrated. In the embodiments illustrated and discussed below, the first component 400 is a card such as, for example, mezzanine card. For example, the mezzanine card illustrated in FIGS. 4a-4c may be a storage mezzanine card such as a Redundant Array of Independent Disks (RAID) mezzanine card. However, one of skill in the art in possession of the present disclosure will recognize that a wide variety of IHS components will benefit from the teachings of the present disclosure and will fall within its scope. The first component 400 includes a card base 402 that may be a circuit board including a variety of card components that have not been illustrated for clarity but that may include processing systems, memory systems, storage systems, heat dissipation devices, and/or a variety of other card components known in the art. The card base 402 includes a top side 402a, a bottom side 402b that is located opposite the card base 402 from the top side 402a, and a front edge 402c that extends between the top side 402a and the bottom side 402b. A primary first component connector 404 is located on the bottom side 402b of the card base 402 and adjacent the front edge 402c of the card base 402. In an embodiment, the primary first component connector 404 may be a compression connector. The primary first component connector 404 includes a plurality of connector pins 406 and a plurality of primary connector retention channels 408 that are located on opposite sides of the plurality of connector pins 406.

A secondary first component connector 410 is located on the top side 402a of the card base 402 and adjacent the front edge 402c of the card base 402. In an embodiment, the secondary first component connector 410 may be a compression connector. The secondary first component connector 410 includes a plurality of connector pins 412, a plurality of primary connector retention channels 414 that are located on opposite sides of the plurality of connector pins 412, and a plurality of guide members 416 that extend from the primary first component connector 410 on opposite sides of the plurality of connector pins 412 and the plurality of primary connector retention channels 414. In the illustrated embodiment, a connector protector 415 (omitted in FIG. 4b for clarity) is coupled to card base 402 adjacent the front edge 402c, and extends around and above the plurality of connector pins 412 in order to protect the plurality of connector pins 412 when, for example, the first component 400 is positioned on a surface. However, in some embodiments the connector protector 415 may be omitted. In an embodiment, the card base 402 may define card base retention channels that align with the primary connector retention channels 408 and the secondary connector retention channels 414 to provide first component retention channels that extend through the primary first component connector 404, the card base 402, and the secondary first component connector 410. In an embodiment, the primary first component connector 404 and the secondary first component connector 410 may each be coupled through the board 402 (e.g., via traces) to a processing system on the board 402 that may operate to, for example, convert signals passing between the primary first component connector 404 and the secondary first component connector 410 and/or perform a variety of other processing functions known in the art. In a specific embodiment, the first component may be provided as part of a stacked compression connector system described in U.S. patent application Ser. No. 14/467,807, attorney docket number 102450.00152, filed on Aug. 25, 2014, the disclosure of which is incorporated by reference herein in its entirety. In an embodiment, the primary first component connector 404 may be directly aligned with the secondary first component connector 410 on opposite sides of the board 402.

Figure 5B:
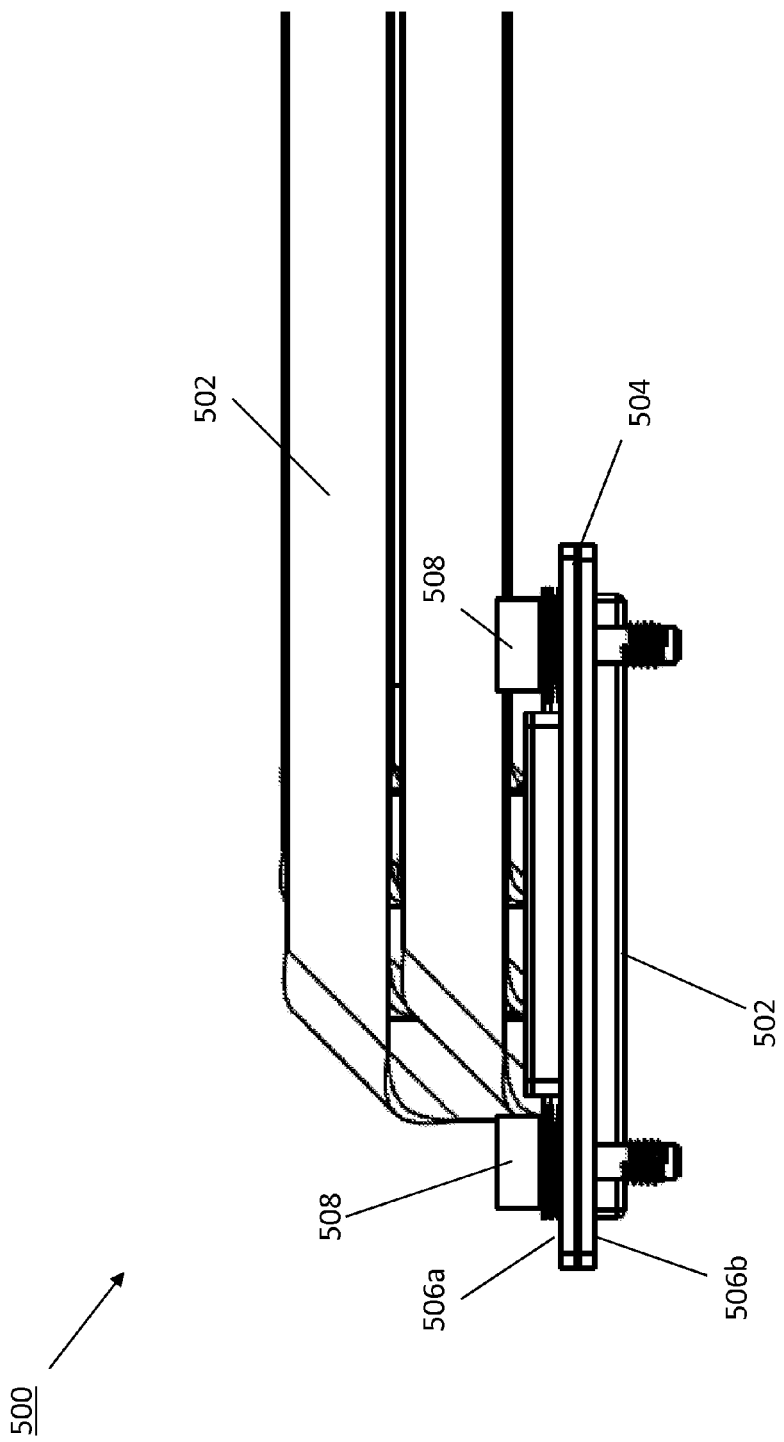
Figure 5C:
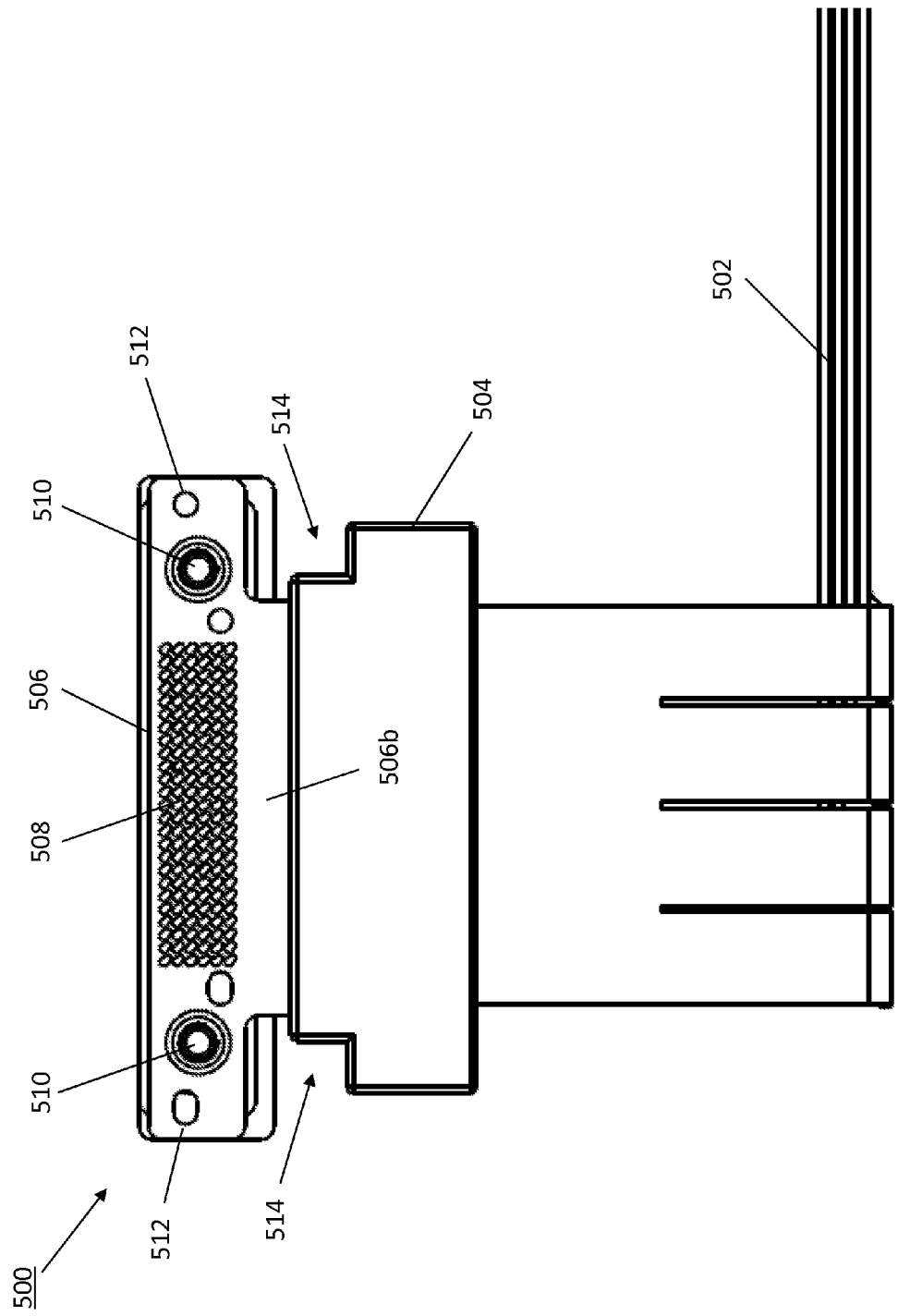
Figure 7A:
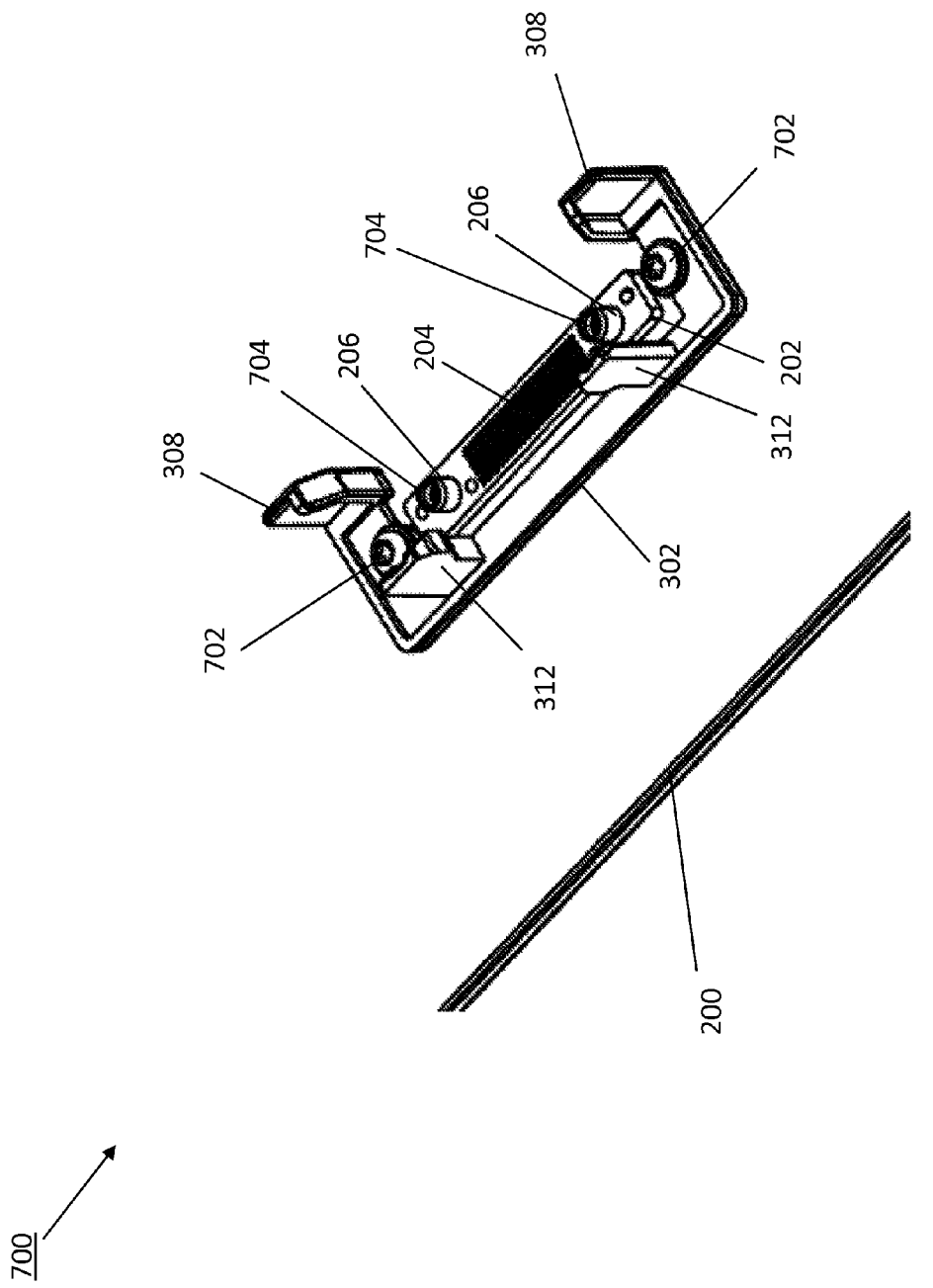
FIG. 7a is a perspective view illustrating an embodiment of the alignment element of FIGS. 3a-3d coupled to the circuit board of FIG. 2.
Figure 7B:
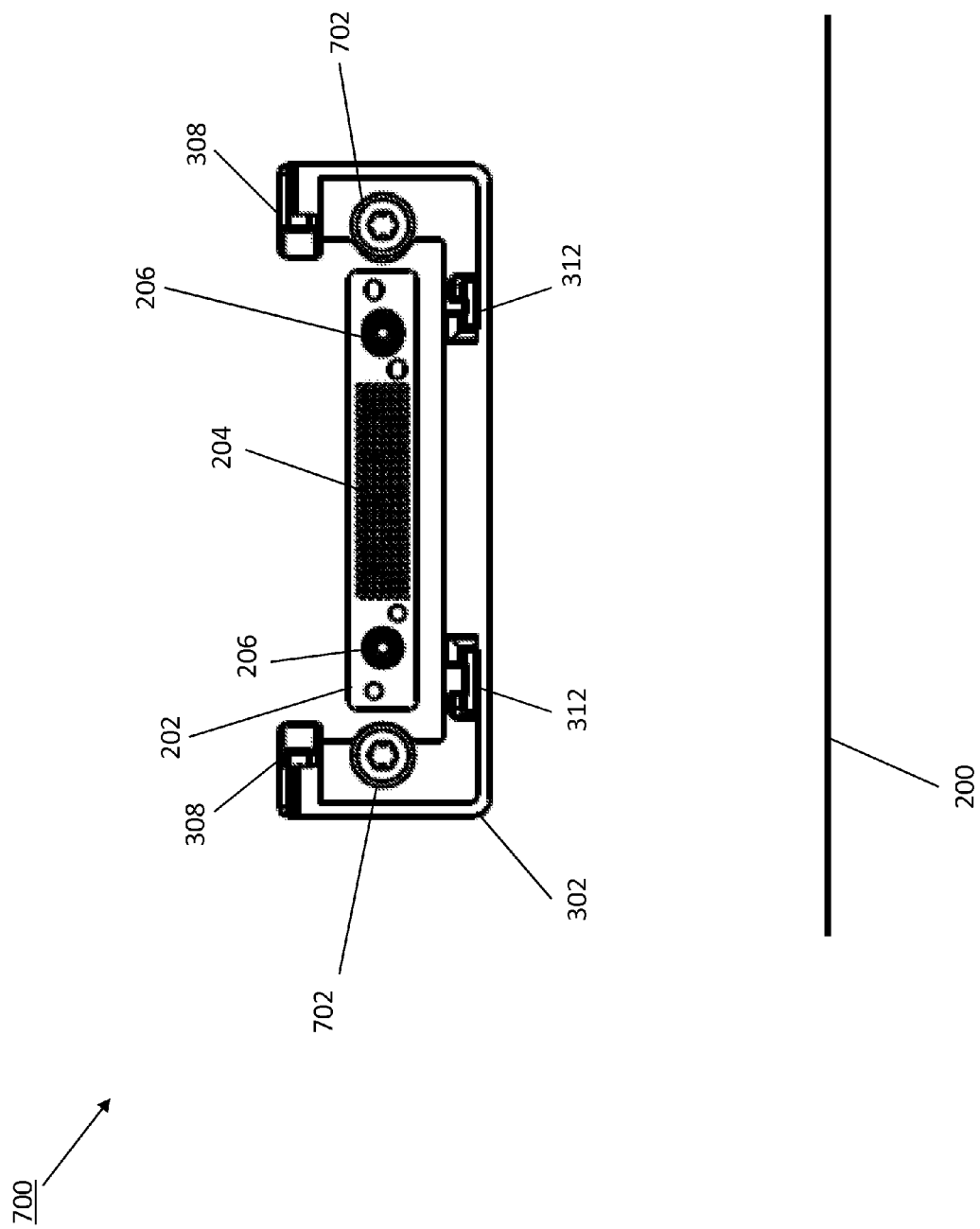

Referring now to FIGS. 5a, 5b, and 5c, an embodiment of a second component 500 is illustrated. In the embodiments illustrated and discussed below, the second component 500 is a cabling system. However, one of skill in the art in possession of the present disclosure will recognize that a wide variety of IHS components will benefit from the teachings of the present disclosure and will fall within its scope. The second component 500 includes cabling 502 that extends from a cabling base 504. A second component connector 506 extends from the cabling base 504 opposite the cabling base 504 from the cabling 502. The second component connector 506 includes a top side 506a and a bottom side 506b that is located opposite the second component connector 506 from the top side 506a. A plurality of connector pads 508 are located on the bottom side 506b of the second component connector 506. A plurality of retention members 510 are coupled to the second component connector 506 such that the each retention member 510 extends from both the top side 506a and the bottom side 506b of the second component connector 506. The second component connector 506 defines a plurality of guide channels 512 that are located on opposite sides of the plurality of connector pads 508 and the plurality of retention members 510. A plurality of second component alignment channels 514 are defined by the cabling base 504 and second component connector 506 and are located opposite the plurality of connector pads 508 from each other. In a specific embodiment, the cabling system 500 may be provided as part of a stacked compression connector system described in U.S. patent application Ser. No. 14/467,807, filed on Aug. 25, 2014, the disclosure of which is incorporated by reference herein in its entirety.

Referring now to FIGS. 2, 3a-d, 6, 7a, and 7b, an embodiment of a method 600 for aligning connectors is illustrated. The method 600 begins at block 602 where a connector alignment system is provided. In an embodiment of block 602, the alignment element 300 discussed above with reference to FIGS. 3a-d is mounted to the board 200 discussed above with reference to FIG. 2 to provide the connector alignment system 700 illustrated in FIGS. 7a and 7b. To mount the alignment element 300 to the board 200, the alignment element 200 is positioned adjacent the board 200 such that the board mounting features 306 defined by the base member 302 are aligned with the second board retention features 208 defined by the board 200, and the board connector 202 on the board 200 is located adjacent the board connector channel 304 defined by the base member 302. Retention members 702 (e.g., screws in the illustrated embodiment) may then be positioned through the board mounting features 306 defined by the base member 302 and engaged with the second board retention features 208 defined by the board 200 in order to secure the alignment element 300 to the board 200 such that the board connector 202 is located immediately adjacent and/or extending into the board connector channel 304. The orientation of the alignment element 300 relative to the board 200 may be selected by the user based on the desired connection orientations of the first component 400 and/or the second component 500. In the embodiment illustrated in FIG. 7a, guide features/retention members 704 have been positioned in the first board retention channels 206 on the board 200. However, the guide features/retention members 704 may be omitted from the connector alignment system 700 while remaining from the scope of the present disclosure.

The method 600 then proceeds to block 604 where a first component is engaged with first alignment members to align a primary first component connector with a board connector. In an embodiment, with the connector alignment system 700 provided as discussed above with reference to block 602, the first component 400 discussed above with reference to FIGS. 4a-4c may be positioned adjacent the alignment element 300 such that the bottom side 402b of the card base 402 faces the board 200 and the primary first component connector 404 is located adjacent the board connector 202, as illustrated in FIG. 8. The first component 400 may then be moved in a direction A relative to and towards the board 200. In response to movement of the of the first component 400 in the direction A, one or more edges of the board 200 adjacent the front edge 402c may engage one or more of the first alignment members 308 on the alignment element 300 to enter the first alignment channel 310. In a specific example, the one or more edges of the board 200 adjacent the front edge 402c may engage the beveled edges 308a on the one or more first alignment members 308 in response to the movement in direction A, which channels the first component 400 into the first alignment channel 304 such that the primary first component connector 404 is aligned with the board connector 202 along a first axis B. In addition, also in response to movement of the of the first component 400 in the direction A, the connector protector 415 (or the front edge 402c of the card base 402 when no connector protector 415 is provided) may engage one or more of the second alignment members 312 on the alignment element 300. In a specific example, the connector protector 415 (or the front edge 402c of the board 200) may engage the first set of beveled edges 312a on the one or more second alignment members 312 in response to the movement in direction A, which operates to align the primary first component connector 404 with the board connector 202 along a second axis C. In some embodiments, the first alignment members 308 and/or the second alignment members 312 may include detents (e.g., below the beveled edges 308a on the first alignment members 308, and below the first set of beveled edges 312a on the second alignment members 312) that may operate to hold the first component 400 in an aligned position engaging the alignment element 300 after moving a sufficient distance in the direction A.

Thus, at block 604, the positioning of the first component 400 adjacent the alignment element 300 and movement in the direction A, as discussed above, operates to align the primary first component connector 404 with the board connector 202 along two axes (e.g., the first axis B and the second axis C in the illustrated embodiment). Alignment of the primary first component connector 404 and the board connector 202 along these two axes operates to align the connector pins 406 on the primary first component connector 404 with the connector pads 204 on the board connector 202, as well as to align the first component retention channels on the first component 400 with the first board retention channels 206 (and in some embodiment, the guide features/retention members 704) on the board connector 202.

The method 600 the proceeds to block 606 where the primary first component connector is connected to the board connector. Continued movement of the first component 400 in the direction A causes the primary first component connector 404 to engage the board connector 202, with the first alignment members 308/first alignment channel 310 and the second alignment members 312 ensuring that the connector pins 406 on the primary first component connector 404 are properly aligned with the connector pads 204 on the board connector 202 for mating, engagement, or otherwise being electrically connected. In addition, in some embodiments the continued movement of the first component 400 in the direction A causes the guide features/retention members 704 to enter the first component retention channels on the first component 400 to further ensure proper alignment of the connector pins 406 and the connector pads 204. However, one of skill in the art in possession of the present disclosure will recognize that the alignment element 400 may negate the need for the guide features/retention members 704 to perform the alignment process. Thus, the connector alignment system 700 operates to ensure alignment of the connector pins 406 and the connector pads 204 on the primary first component connector 404 and the board connector 202, respectively, in order to prevent possible damage that may occur in response to an attempt to connect them in an unaligned state. In some embodiments, a latch may be included on the alignment element 300 and configured to extend across the alignment element 300 and into engagement with the first component 400 in order to provide a load on the first component 400 that ensures an electrical connection between the primary first component connector 404 and the board connector 202.

Figure 9:
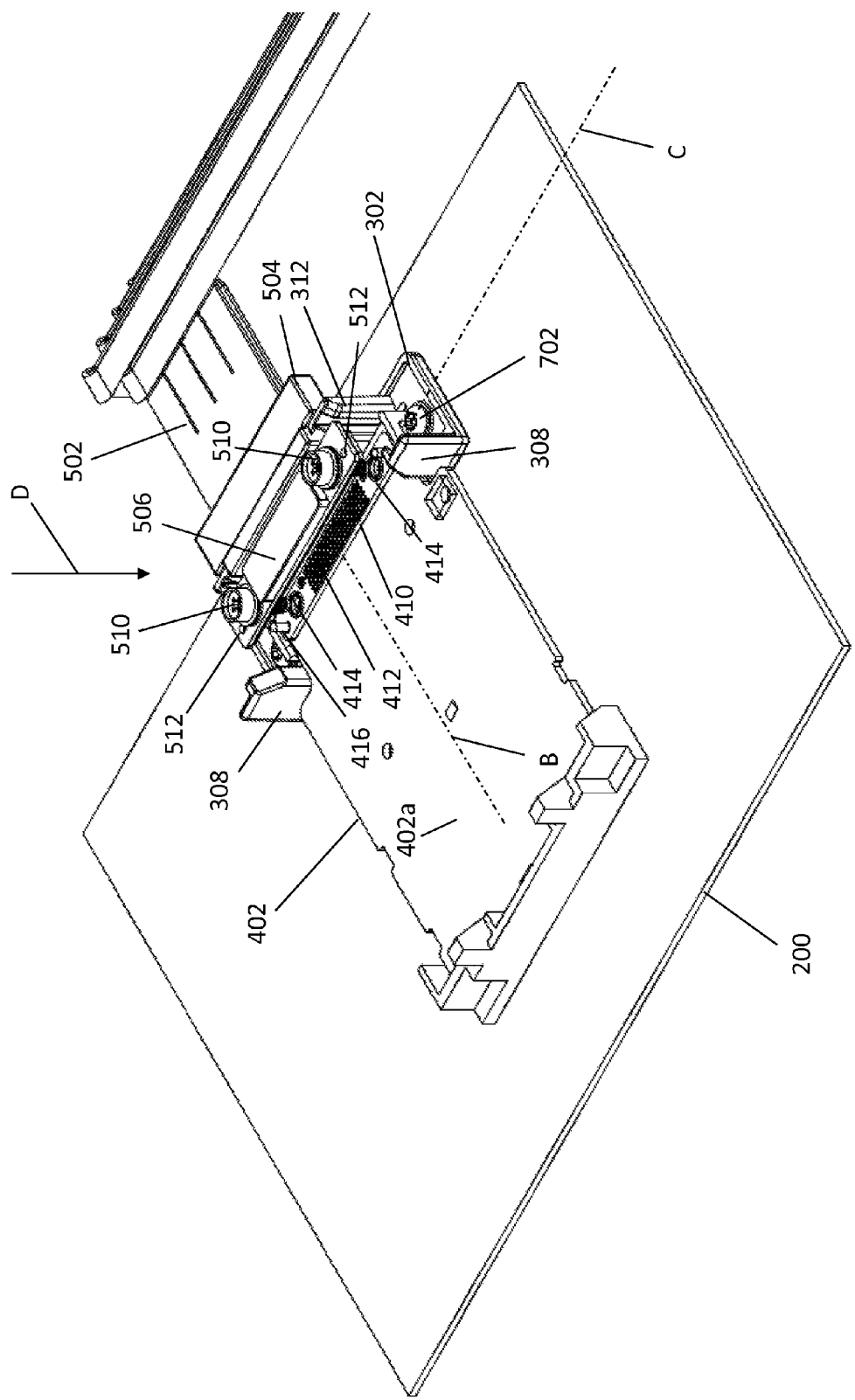
FIG. 9 is a perspective view illustrating an embodiment of the cable of FIGS. 5a and 5b being connected to the connected card and circuit board of FIG. 8 using the alignment element of FIGS. 3a-3d.

The method 600 then proceeds to block 608 where a second component is engaged with second alignment members to align a second component connector with a secondary first component connector. In an embodiment, with the primary first component connector 404 mated with, engaging, or otherwise prepared for electrical connection with the board connector 202, as discussed above with reference to blocks 604 and 606, the second component 500 discussed above with reference to FIGS. 5a-5c may be positioned adjacent the alignment element 300 such that the bottom side 506b of the second component connector 506 faces the board 200, the second component connector 506 is located adjacent the secondary first component connector 410 on the first component 400, and the second component alignment channels 514 on the second component 500 are aligned with the second alignment members 512, as illustrated in FIG. 9. The second component 500 may then be moved in a direction D relative to and towards the board 200. In response to movement of the second component 500 in the direction D, the second alignment members 312 on the alignment element 300 enter the second component alignment channels 514 on the second component 500, the second component connector 506 engages one or more of the second alignment members 312, and the second component 500 enters the second alignment channel 314. In a specific example, portions of the cabling base 504 and the second component connector 506 that define the second component alignment channels 514 may engage the second set of beveled edges 312a on the one or more second alignment members 312 in response to the movement in direction D, which channels the second component 500 into the second alignment channel 314 such that the second component connector 506 is aligned with the secondary first component connector 410 along the first axis B. In addition, also in response to movement of the of the second component 500 in the direction D, portions of the cabling base 504 and the second component connector 506 that define the second component alignment channels 514 may engage the second set of beveled edges 312a on the one or more second alignment members 312 in response to the movement in direction D, which operates to align the second component connector 506 with the secondary first component connector 410 along the second axis C. In some embodiments, the second alignment members 312 may include detents (e.g., below the first set of beveled edges 312a and/or the second set of beveled edges 312b on the second alignment members 312) that may operate to hold the second component 500 in an aligned position engaging the alignment element 300 after moving a sufficient distance in the direction D.

Thus, at block 608, the positioning of the second component 500 adjacent the alignment element 300 and movement in the direction D, as discussed above, operates to align the second component connector 506 with the secondary first component connector 410 along two axes (e.g., the first axis B and the second axis C in the illustrated embodiment). Alignment of the second component connector 506 and the secondary first component connector 410 along these two axes operates to align the connector pads 508 on the second component connector 506 with the connector pins 412 on the secondary first component connector 410, to align the first component retention channels on the first component 400 with the retention members 510 on the second component connector 506, and to align the guide members 416 on the secondary first component connector 410 with the guide channels 512 on the second component connector 506.

The method 600 the proceeds to block 610 where the second component connector is connected to the secondary first component connector. Continued movement of the second component 500 in the direction D causes the second component connector 506 to engage the secondary first component connector 410, with the second alignment members 312/second alignment channel 314 ensuring that the connector pins 412 on the secondary first component connector 410 are properly aligned with the connector pads 508 on the second component connector 506 for mating, engagement, or otherwise being electrically connected. In addition, in some embodiments the continued movement of the second component 500 in the direction D causes the guide members 416 to enter the guide channels 512 on the second component connector 506 to further ensure proper alignment of the connector pins 412 and the connector pads 508. However, in some embodiments, the guide members 416 may be omitted, and only the alignment element 300 may operate to align the second component connector 506 and the secondary first component connector 410. Thus, the connector alignment system 700 operates to ensure alignment of the connector pins 412 and the connector pads 508 on the second component connector 506 and the secondary first component connector 410, respectively, in order to prevent possible damage that may occur in response to an attempt to connect them in an unaligned state. Upon engaging the second component connector 506 and the secondary first component connector 410, the retention members 510 extend through the first component retention channels defined by the first component 400, and may be engaged with the first board retention channels 206 to secure both the first component 400 and the second component 500 to the board 200 and to ensure mating, engagement, and/or electrical connection of the primary first component connector 404 with the board connector 202 and of the secondary first component connector 410 with the second component connector 506. In some embodiments, a latch may be included on the alignment element 300 and configured to extend across the alignment element 300 and into engagement with the second component 500 in order to provide a load on the second component 500 that ensures an electrical connection between the second component connector 506 and the secondary first component connector 410 and/or the primary first component connector 404 and the board connector 202.

Thus, a connector alignment system and method has been described that provide for the alignment of stacked compression connector by aligning multiple components and multiple compression connectors to ensure that connector pads and pins are not damaged in an attempt to connect misaligned components. In specific embodiments, the connector alignment systems and methods of the present disclosure provide an alignment element that provides for the alignment of multiple components that include compression connectors that are presented to other compression connectors from different directions using alignment members that provide for the alignment of those components along multiple axes. While the embodiments illustrated and described above includes only two stacked components (the first component 400 and the second component 500), additional components with similar compression connectors may be provided, aligned, and connected in substantially the same manner using the alignment element (or similar alignment elements) while remaining within the scope of the present disclosure. For example, a third component with compression connectors similar to those on the first component may be aligned with and connected to the compression connectors on the first component, a fourth component with compression connectors similar to those on the first component may be aligned with and connected to the compression connectors on the third component, and the second component may be aligned with and connected to the compression connectors on the fourth component similarly as discussed above to mate and secure all the compression connectors on the board, the first component, the second component, the third component, and the fourth component.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A connector alignment system, comprising:
   a base member that defines a board connector channel and that is configured to be located adjacent a board connector such that the board connector is located in the board connector channel;
   a plurality of first alignment members that extend from the base member to define a first alignment channel, wherein the plurality of first alignment members are configured to align a primary first component connector subsystem on a first component with the board connector when the base member is located adjacent the board connector and the primary first component connector subsystem is moved through the first alignment channel; and
   a plurality of second alignment members that extend from the base member to define a second alignment channel that is spaced apart from the first alignment channel, wherein the plurality of second alignment members are configured to align a second component connector subsystem with a secondary first component connector subsystem on the first component when the primary first component connector subsystem is connected to the board connector and the second component connector subsystem is moved through the second alignment channel.

2. The connector alignment system of claim 1, wherein the plurality of second alignment members are configured to align the second component connector subsystem with the secondary first component connector subsystem along a first axis, and wherein the plurality of second alignment members are configured to align the primary first component connector subsystem with the board connector along a second axis that is different than the first axis when the base member is located adjacent the board connector and the primary first component connector subsystem is moved through the first alignment channel.

3. The connector alignment system of claim 1, wherein the plurality of second alignment members are configured to align the second component connector subsystem with the secondary first component connector subsystem along a first axis, and wherein the plurality of second alignment members are configured to align the second component connector subsystem with the secondary first component connector subsystem along a second axis that is different than the first axis when the primary first component connector subsystem is connected to the board connector and the second component connector subsystem is moved through the second alignment channel.

4. The connector alignment system of claim 1, further comprising:
   a board including the board connector, wherein the base member extends from the board.

5. The connector alignment system of claim 1, wherein the plurality of first alignment members include beveled edges that are configured to align the primary first component connector subsystem with the board connector when the base member is located adjacent the board connector and the primary first component connector subsystem is moved through the first alignment channel.

6. The connector alignment system of claim 1, wherein the plurality of second alignment members include beveled edges that are configured to align the primary first component connector subsystem with the board connector when the base member is located adjacent the board connector, align the second component connector subsystem with the secondary first component connector subsystem along a first axis when the primary first component connector subsystem is connected to the board connector, and align the second component connector subsystem with the secondary first component connector subsystem along a second axis when the primary first component connector subsystem is connected to the board connector.

7. An information handling system (IHS), comprising:
a board including a processing system and a board connector that is coupled to the processing system;
an alignment element that defines a board connector channel and that extends from the board adjacent the board connector such that the board connector is located adjacent the board connector channel, wherein the alignment element includes a plurality of first alignment members that define a first alignment channel and a plurality of a second alignment members that are spaced apart from the plurality of first alignment members and that define a second alignment channel;
a first component including a primary first component connector subsystem and a secondary first component connector subsystem that is located on an opposite surface of the first component from the primary first component connector subsystem, wherein the plurality of first alignment members are configured to align the primary first component connector subsystem with the board connector in response to the primary first component connector subsystem moving through the first alignment channel; and
a second component including a second component connector subsystem, wherein the plurality of second alignment members are configured to align the second component connector subsystem with the secondary first component connector subsystem when the primary first component connector subsystem is connected to the board connector and in response to the second component connector subsystem moving through the second alignment channel.

8. The IHS of claim 7, wherein the first component includes a card and the second component includes a cabling system.

9. The IHS of claim 7, wherein the plurality of first alignment members are configured to align the primary first component connector subsystem with the board connector along a first axis, and wherein the plurality of second alignment members are configured to align the primary first component connector subsystem with the board connector along a second axis that is different than the first axis.

10. The IHS of claim 7, wherein the plurality of second alignment members are configured to align the second component connector subsystem with the secondary first component connector subsystem along a first axis, and wherein the plurality of second alignment members are configured to align the second component connector subsystem with the secondary first component connector subsystem along a second axis that is different than the first axis.

11. The IHS of claim 7, wherein at least one guide member extends from the board adjacent the board connector, and wherein the first component connector subsystem defines at least one guide channel that is configured to receive the at least one guide member.

12. The IHS of claim 7, wherein at least one guide member extends from the first component connector subsystem adjacent the secondary first component connector subsystem, and wherein the second component defines at least one guide channel that is configured to receive the at least one guide member.

13. The IHS of claim 7, wherein the board defines a board retention channel and the first component connector subsystem defines a first component retention channel, and wherein the second component connector subsystem includes a retention member that is configured to extend through the first component retention channel and engage the board retention channel to secure the primary first component connector subsystem to the board connector and to secure the second component connector subsystem to the secondary first component connector subsystem.

14. A method for aligning connectors, comprising:
providing an alignment device that defines a board connector channel and is located adjacent a board connector such that the board connector is located adjacent the board connector channel, wherein the alignment device also includes a plurality of first alignment members that define a first alignment channel and a plurality of a second alignment members that are spaced apart from the plurality of first alignment members and define a second alignment channel;
moving a primary first component connector subsystem on a first component through the first alignment channel such that the primary first component connector subsystem engages the plurality of first alignment members to align and connect the primary first component connector subsystem and the board connector; and
moving a second component connector subsystem through the second alignment channel such that the second component connector subsystem engages the plurality of second alignment members to align and connect the second component connector subsystem and the secondary first component connector subsystem.

15. The method of claim 14, wherein the first component includes a card and the second component connector subsystem is provided on a cabling system.

16. The method of claim 14, wherein the engagement of the primary first component connector subsystem with the plurality of first alignment members aligns the primary first component connector subsystem and the board connector along a first axis, and wherein the method further comprises:
engaging the primary first component connector subsystem with the plurality of second alignment members to align the primary first component connector subsystem with the board connector along a second axis that is different than the first axis.

17. The method of claim 14, wherein the engagement of the second component connector subsystem with the plurality of second alignment members aligns the second component connector subsystem and the secondary first component connector subsystem along a first axis, and wherein the method further comprises:
engaging the second component connector subsystem with the plurality of second alignment members to align the second component connector subsystem with the secondary first component connector subsystem along a second axis that is different than the first axis.

18. The method of claim 14, further comprising:
receiving at least one guide member that extends from the board adjacent the board connector with at least one guide channel that is defined by the first component connector subsystem.

19. The method of claim 14, further comprising:
receiving at least one guide member that extends from the first component connector subsystem adjacent the secondary first component connector subsystem with at least one guide channel that is defined by the second component connector subsystem.

20. The method of claim 14, further comprising:
extending a retention member that is included on the second component connector subsystem through a first component retention channel defined by the first component connector subsystem; and
engaging the retention member with a board retention channel that is defined by the board to secure the primary first component connector subsystem to the board connector and to secure the second component connector subsystem to the secondary first component connector subsystem.

\* \* \* \* \*